(12) United States Patent
Beck

(10) Patent No.: US 7,332,428 B2
(45) Date of Patent: Feb. 19, 2008

(54) METAL INTERCONNECT STRUCTURE AND METHOD

(75) Inventor: Michael Beck, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/067,877

(22) Filed: Feb. 28, 2005

(65) Prior Publication Data

US 2006/0194430 A1    Aug. 31, 2006

(51) Int. Cl.
*H01L 23/48* (2006.01)

(52) U.S. Cl. .............. 438/637; 257/751; 257/622; 257/E23.141; 438/639; 438/625

(58) Field of Classification Search ............. 257/750, 257/751, 752; 438/622, 643, 648, 625, 637, 438/639
See application file for complete search history.

(56) References Cited

U.S. PATENT DOCUMENTS

| | | | |
|---|---|---|---|
| 5,470,790 A | 11/1995 | Myers et al. | |
| 5,696,422 A | 12/1997 | Hanson et al. | |
| 5,965,679 A | 10/1999 | Godschalx et al. | |
| 5,969,422 A | 10/1999 | Ting et al. | |
| 6,040,243 A | 3/2000 | Li et al. | |
| 6,218,283 B1 | 4/2001 | Park et al. | |
| 6,358,838 B2 | 3/2002 | Furusawa et al. | |
| 6,451,177 B1 | 9/2002 | Gopalraja et al. | |
| 6,486,059 B2 | 11/2002 | Lee et al. | |
| 6,498,091 B1 * | 12/2002 | Chen et al. | 438/627 |
| 6,528,409 B1 | 3/2003 | Lopatin et al. | |
| 6,531,780 B1 * | 3/2003 | Woo et al. | 257/758 |
| 6,613,664 B2 | 9/2003 | Barth et al. | |
| 6,723,635 B1 * | 4/2004 | Ngo et al. | 438/627 |
| 6,740,580 B1 * | 5/2004 | Gupta et al. | 438/627 |
| 6,806,579 B2 | 10/2004 | Cowley et al. | |
| 6,861,347 B2 * | 3/2005 | Lee et al. | 438/622 |
| 6,878,615 B2 | 4/2005 | Tsai et al. | |
| 6,908,847 B2 * | 6/2005 | Saito et al. | 438/627 |
| 2002/0098673 A1 | 7/2002 | Yeh et al. | |
| 2002/0109234 A1 | 8/2002 | Park et al. | |
| 2002/0117399 A1 | 8/2002 | Chen et al. | |
| 2002/0171147 A1 | 11/2002 | Yew et al. | |
| 2003/0160331 A1 | 8/2003 | Fujisawa | |
| 2003/0194872 A1 | 10/2003 | Parikh et al. | |
| 2004/0009668 A1 | 1/2004 | Catabay et al. | |
| 2004/0150103 A1 | 8/2004 | Cooney, III et al. | |
| 2004/0152295 A1 | 8/2004 | Cooney, III et al. | |

* cited by examiner

*Primary Examiner*—Zandra V. Smith
*Assistant Examiner*—Christy L Novacek
(74) *Attorney, Agent, or Firm*—Slater & Matsil, L.L.P.

(57) ABSTRACT

In a method of fabricating a semiconductor device, a dielectric layer is formed over a conductive region. A dual damascene structure including a trench and a via is formed within the dielectric layer. A liner is formed over the dual damascene structure. The liner is selectively removed from above the upper surface of the conductive region to expose the upper surface of the conductive region. After the selectively removing process, at least a portion of the liner remains over the lower surface of the trench and the sidewalls of the trench and the via hole. A wet etch can then be performed to etch a recess in the conductive region. A conductive material is then formed within the damascene structure. This conductive material physically contacts the conductive region and is separated from the dielectric layer by the remaining portion of the liner.

33 Claims, 6 Drawing Sheets

METAL INTERCONNECT STRUCTURE AND METHOD

TECHNICAL FIELD

The present invention relates generally to semiconductor devices and methods, and more particularly to a metal interconnect structure and method.

BACKGROUND

Semiconductors are widely used for integrated circuits for electronic applications, including radios, televisions and personal computing devices, as examples. Such integrated circuits typically use multiple transistors fabricated in single crystal silicon. It is common for there to be millions of semiconductor devices on a single semiconductor product. Many integrated circuits now include multiple levels of metallization for interconnections.

The semiconductor industry continuously strives to decrease the size of the semiconductor devices located on integrated circuits. Miniaturization is generally needed to accommodate the increasing density of circuits necessary for today's semiconductor products. In the past, the material typically used to isolate conductive leads from each other has been silicon dioxide; however, the dielectric constant (k) of silicon dioxide deposited by chemical vapor deposition is on the order of 4.1 to 4.2. The dielectric constant is based on a scale where 1.0 represents the dielectric constant of a vacuum. Silicon dioxide provides a minimal thermal expansion coefficient mismatch with conductive layer materials, and is a strong material.

Low-k materials are now being used for the insulating material separating conductive layers and metal leads of semiconductor devices in order to reduce the capacitive coupling between interconnect lines. Widely used low-k materials comprise organic spin-on materials, which must be heated to remove the liquid, or solvent. Often these low-k materials have a high thermal expansion coefficient compared to metals and silicon dioxide.

Semiconductor wafers are frequently temperature-cycled during fabrication due to the nature of the manufacturing process. When a device comprises multiple metallization and dielectric layers, the solvent-removing heating step for the low-dielectric constant material layers must be repeated numerous times (e.g., each layer must be cured), which can be problematic, especially for the lower layers of the device. The mismatch of thermal expansion coefficients of metal leads and low-k dielectric layers causes thermo-mechanical stress, leading to increased resistances, delaminations, electrical intermittencies and opens, resulting in reduced yields.

FIGS. 1 and 2 show prior art structures 100 and 160 for prior methods of fabricating multi-layer interconnects of an integrated circuit on a semiconductor wafer. FIG. 1 shows a single damascene approach and FIG. 2 shows a dual damascene approach.

Referring first to the structure 100 shown in FIG. 1, a substrate 102 is provided, typically comprising silicon oxide over single-crystal silicon. The substrate 102 may include other conductive layers or other semiconductor elements, e.g., transistors, diodes, etc. Compound semiconductors such as GaAs, InP, Si/Ge, SiC are often used in place of silicon.

A first dielectric layer 104 is deposited over the substrate 102. In the prior art structure described herein, dielectric 104 comprises a low-dielectric constant material, having a dielectric constant k of 3.6 or less, for example. Low-k dielectric material 104 comprises an organic spin-on material such as a polyimide or others. Trademarks for such materials include Dow Chemical Corporation's SiLK™ and AlliedSignal Inc.'s Flare™ for example. After spinning on low-k dielectric 104, the wafer 100 is exposed to a heating step (e.g., baked) to remove the solvents and cure the dielectric material. Temperatures of the heating step may reach 400 degrees C., for example. Other low-k dielectrics can be deposited by chemical vapor deposition.

Dielectric material 104 is patterned and etched, and conductive lines 108 are formed. An optional conductive liner 106 may be deposited prior to formation of conductive lines 108. Conductive liner 106 typically comprises Ta, TaN, WN, TiN, etc., and conductive lines 108 may comprise conductive materials such as aluminum, copper, other metals, or combinations thereof, for example.

An optional dielectric cap layer 110 comprising SiN, for example, is deposited over conductive lines 108 and low-k dielectric 104. A second layer of dielectric material 112 is deposited over conductive lines 108. Second dielectric layer 112 comprises a low-k material and thus must be baked at up to 400° C. to remove solvents. Dielectric layer 112 is patterned, e.g., with a mask, and via openings are formed using an etch process step, preferably an anisotropic etch process which is substantially directed towards the perpendicular surface of the wafer. A small portion of the tops of conductive lines 108 is typically etched during the anisotropic etch process, as shown by the recess at 122.

The via openings are filled with a metallic material, preferably the same as the material used for the conductive lines 108, for example, to form vias 116. Vias 116 are typically substantially cylindrical, and may have a slightly greater diameter at the tops than at the bottoms due to the via opening etch process not being entirely perpendicular to the wafer 100 surface.

A third dielectric layer 114 comprising a low-k dielectric material, for example, is deposited over vias 116, heated to remove the solvents, patterned and etched. Conductive lines 120 are formed over vias 116 to provide a connection to conductive lines 108 in the underlying first dielectric layer 104. An optional conductive liner 118 may be deposited prior to the formation of conductive lines 120. Conductive lines 120 preferably comprise a metal material the same as conductive lines 108, for example. Many other conductive layers may be deposited in this manner. It is not uncommon to have up to six conductive layers within a semiconductor structure.

FIG. 2 shows generally at 160 a prior art dual damascene approach of forming multi-layer interconnects of an integrated circuit. A substrate 102 is provided, and a first dielectric layer 104 is deposited over the substrate 102. Dielectric material 104 may comprise a low-k dielectric. Dielectric material 104 is patterned and etched, and conductive lines 108 are formed. An optional conductive liner 106 may be deposited prior to formation of conductive lines 108.

An optional dielectric cap layer 110 is deposited over conductive lines 108 and low-k dielectric 104. A second layer of dielectric material 162 is deposited over conductive lines 108. In a dual damascene approach, second dielectric layer 162 is thicker than in a single damascene approach, because both via 170 and metal line 168 are formed within the second dielectric layer 162. Alternatively, an etch stop material 171 may be deposited near the interface of the via 170 and metal line 168, as shown in phantom.

Dielectric layer 162 is patterned and etched, generally in two separate steps to form via 170 holes and trenches for metal lines 168. The via 170 hole may be formed first, followed by the formation of metal line 168 trench, or vice versa. A liner 164 may be deposited over the via hole and the metal line trench. The via openings and metal line trench are filled with a metallic material, preferably the same as the material used for the conductive lines 108, for example, to form vias 170 and metal lines 168.

SUMMARY OF THE INVENTION

These and other problems are generally solved or circumvented, and technical advantages are generally achieved, by preferred embodiments of the present invention which provide a metal interconnect structure and method.

In accordance with a preferred embodiment method of fabricating a semiconductor device, a dielectric layer is formed over a conductive region. A dual damascene structure including a trench and a via is formed within the dielectric layer. A liner is formed over the dual damascene structure. The liner is selectively removed from above the upper surface of the conductive region to expose the upper surface of the conductive region. After the selectively removing process, at least a portion of the liner remains over the lower surface of the trench and the sidewalls of the trench and the via hole. A wet etch can then be performed to etch a recess in the conductive region. A conductive material is then formed within the damascene structure. This conductive material physically contacts the conductive region and is separated from the dielectric layer by the remaining portion of the liner.

In accordance with another preferred embodiment of fabricating a semiconductor device, a wafer includes a first copper interconnect line formed over an upper surface. A dielectric is formed over the first copper interconnect line. A trench is formed in an upper portion of the dielectric layer and a via hole is formed in a lower portion of the dielectric layer. A liner is deposited over the wafer. A selective etching process selectively removes the liner from the upper surface of the first copper interconnect so that at least a portion of the liner remains over the sidewall surface of the trench, the lower surface of the trench, and the sidewall surface of the via hole. The selective etching process further creates a recess in the first copper interconnect beneath the via hole. The recess extends a depth that is at least 30% of the thickness of the first copper interconnect. Copper is then deposited within the via hole and the trench. Preferably, the copper is deposited directly within the recess in the first copper interconnect and in contact with remaining portions of the liner along the sidewall surface of the trench. An upper surface of the deposited copper can then be planarized so that the copper deposited in the trench forms a second copper interconnect line.

In yet another embodiment, a semiconductor interconnect structure includes a first metal region of a first metal material. A dielectric region overlies the first metal region and includes a via hole overlying the first metal region and a trench overlying the via hole. A conductive contact is disposed within the via hole and electrically contacting the first metal region. A second metal region of the first metal material is disposed within the trench and physically and electrically contacts the conductive contact. A first liner is disposed between the conductive contact and the dielectric region and also between the second metal region and the dielectric region. The first liner does not extend between the conductive contact and the first metal region. A second liner is disposed between the conductive contact and the dielectric region and also between the second metal region and the dielectric region. The second liner, however, does extend between the conductive contact and the first metal region.

Embodiments of the invention are useful since they are especially tailored for use with low-k dielectrics. Low k dielectrics can be used to improve the capacitive delay in the chip level interconnect. Use of aspects of the present invention can provide greater mechanical stability when using low-k materials, since these materials my have free volume (e.g., voids or pores) that lead to weaker mechanical stability of the stack.

In another aspect, the present invention provides improved electrical conductivity between levels of metal since the higher resistance liner can be removed or reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a dual damascene metallization scheme. The invention may also be applied, however, to other interconnect structures.

Figure 1:
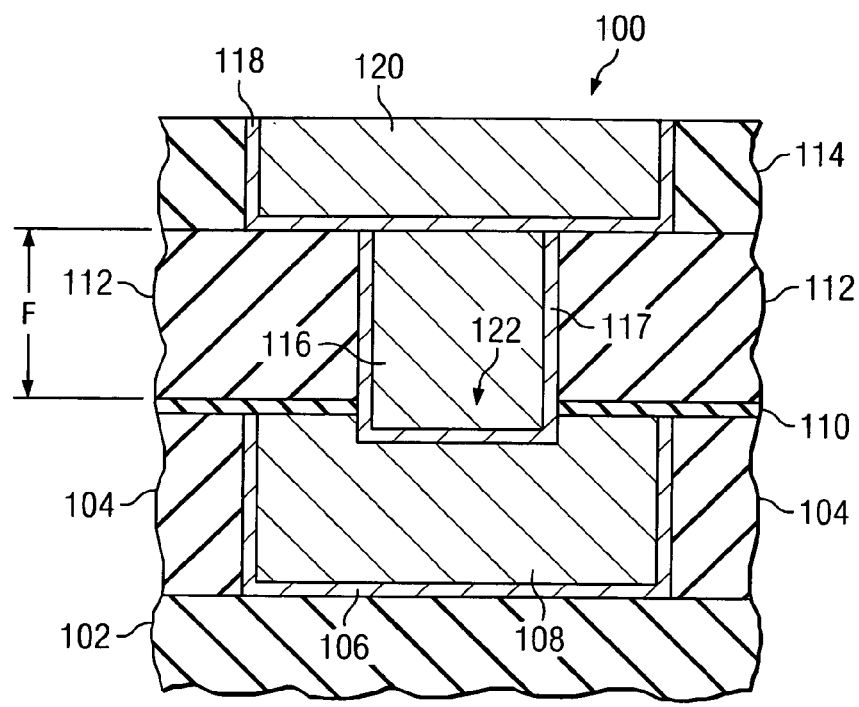
FIG. 1 illustrates a cross-sectional view of a prior art integrated circuit structure having vias connecting conductive lines of the various conductive layers in a single damascene approach.
Figure 2:
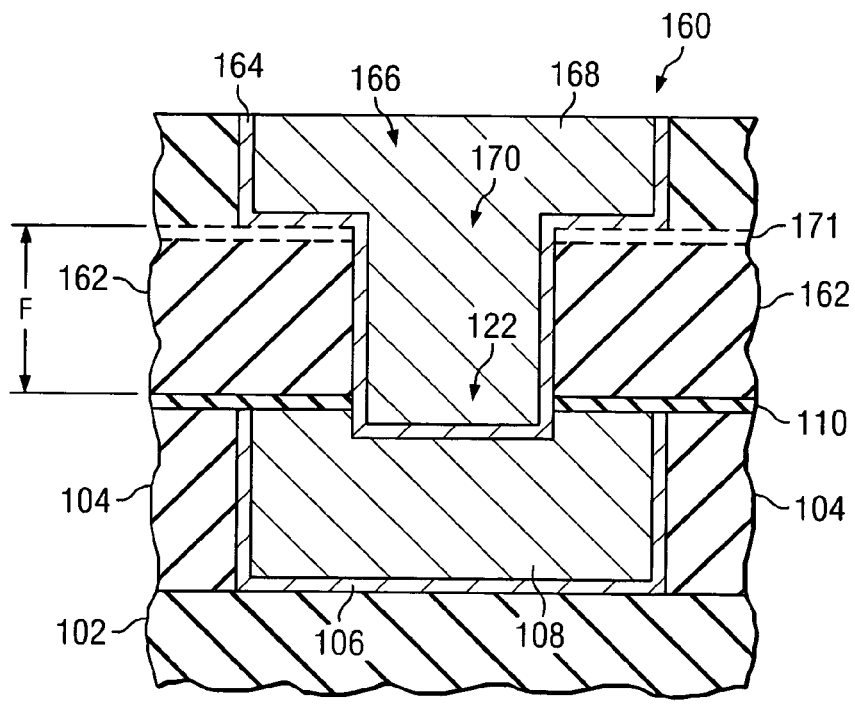
FIG. 2 illustrates a cross-sectional view of a prior art integrated circuit structure having vias connecting conductive lines of the various conductive layers in a dual damascene approach.
Figure 3:
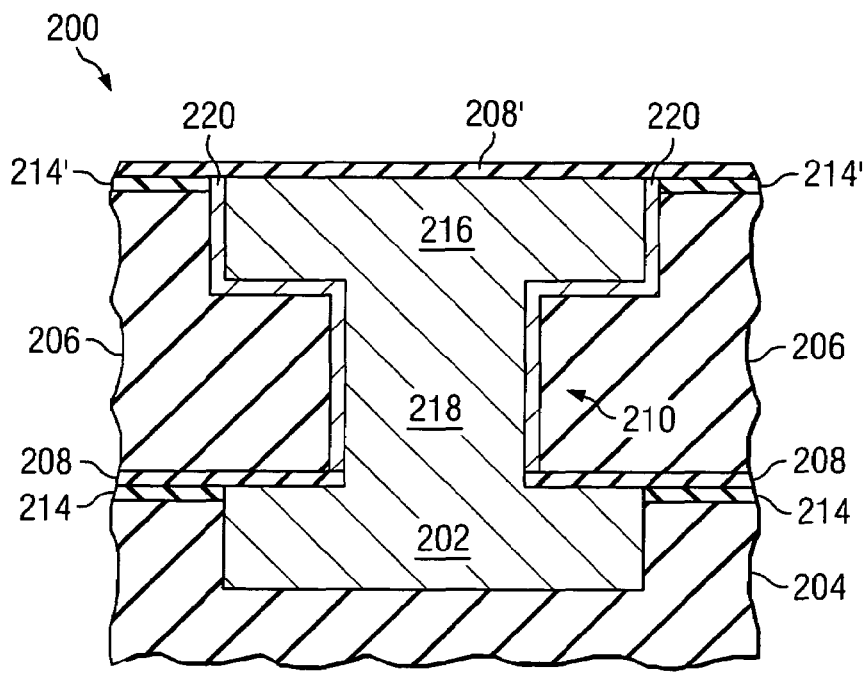
FIG. 3 illustrates a cross-sectional view of an integrated circuit structure of a first embodiment of the invention.

A preferred embodiment interconnect structure is illustrated in FIG. 3. One embodiment for fabricating this structure is illustrated in FIGS. 4-9. As will be explained below, and as would be understood by one of ordinary skill in the art, various modifications of the specific structure and process are possible.

Referring first to FIG. 3, an interconnect structure 200 is formed over a semiconductor wafer. While not illustrated, the semiconductor typically includes a number of active circuit components formed in a semiconductor body. The semiconductor body can be a bulk substrate (e.g., monocrystalline silicon) or a semiconductor-over-insulator (SOI) layer, as just two examples. The active circuit components preferably comprise transistors. Other components such as diodes, resistors and capacitors can also be formed.

The interconnect structure 200 includes a first metal region 202 that is surrounded by dielectric material 204. In the typical case, the first metal region 202 is part of a first metal layer that was formed as one of a number of metallization levels in an integrated circuit. As an example, the first metal layer can be the first metal layer over the active components (often referred to as metal 1). In other examples, the metal layer can be an upper metal layer (e.g., metal 2 or metal 5, as arbitrary examples).

In the preferred embodiment, the first metal region 202 is a copper damascene (either single damascene or dual damascene) interconnect. As such, the first metal region 202 is embedded in dielectric 204. In other embodiments, the first metal region 202 can be a different material such as aluminum, tungsten or gold and may be embedded in two separate layers.

Dielectric layer 206 overlies the first metal region 202 and the dielectric material 204. The dielectric layer 206 can comprise any dielectric material such as an oxide (e.g., $SiO_2$) or a doped oxide (e.g., PSG, BPSG, FSG, or BSG). In the preferred embodiment, dielectric layer 206 comprises a low-k dielectric. In this context, a low-k dielectric, which can be either porous or non-porous, is a dielectric that has a dielectric constant less than the dielectric constant of undoped silicon dioxide. The low-k dielectric material can be an organic spin-on material such as a polyimide or others. Examples of porous low-k dielectric include SiLK™ available from Dow Chemical Corporation and Flare™ available from AlliedSignal Inc. In the preferred embodiment, the dielectric 206 is formed from SiCOH, either dense SiCOH or porous SiCOH (pSiCOH).

A dielectric layer 208 is optionally included between dielectric 204 and dielectric 206. The dielectric layer 208 is preferably a different material and may serve as cap layer, as described in further detail below. Alternatively, or in addition, the dielectric layer 208 can serve as an etch stop layer, a diffusion barrier or a passivation layer. In one example, the dielectric layer 208 includes more than one layer of materials. For example, the dielectric layer can include one or more of a nitride layer (e.g., $Si_3N_4$), an oxynitride layer (e.g., SiON), an oxide layer (e.g., $SiO_2$), a dense oxide layer, or other material. In the preferred embodiment, the cap layer 208 is formed from a SiCN material, such as NBLOK™.

A dielectric layer 214 is also optionally included between the dielectric 204 and the dielectric 206. This dielectric 214 serves as a hard mask to protect the dielectric 204 during the chemical mechanical polishing step that completes formation of metal region 202. Layer 214 can also serve as a barrier for some porous low k materials to prevent moisture from coming into the ILD 206. For some embodiments that do not require this function, the layer can be omitted.

The dielectric 214 can be the same or a different material as dielectric 208. As such, the dielectric layer 214 can include one or more of a nitride layer (e.g., $Si_3N_4$), an oxynitride layer (e.g., SiON), an oxide layer (e.g., $SiO_2$), a dense oxide layer, or other material. In the preferred embodiment, the hard mask layer 214 is formed from a SiCN material, such as NBLOK™.

The first dielectric layer includes a via hole 210 that provides access to the metal region 202. The via hole 210 may be any size to accommodate the design but is typically at the design minimum. For example, the process and structure taught herein is particularly useful at small dimensions of less than 100 nm (e.g., 90 nm, 65 nm, 45 nm or below). The via hole 210 may be formed in any of a number of shapes as viewed from a plan view (not shown) but is typically circular or elliptical.

A conductive contact 218 fills the via hole 210 and is electrically connected to the metal region 202. In the preferred embodiment, the conductive contact 218 is formed from the same material (e.g., copper) as metal region 202 and physically contacts the metal region 202. For this reason, the metal region 202 and contact 218 are illustrated as a single region in FIG. 3.

In the preferred embodiment, the dielectric layer 206 includes a trench that is filled with conductive material 216. The conductive material 216 preferably formed a metal region and is part of a second metal layer relative to the first metal layer 202 (i.e., if region 202 is part of metal 3 than region 216 is part of metal 4). The metal region 216 is preferably formed from the same material (e.g., copper) as contact 218 (and metal region 202) and physically contacts the conductive contact 218. For this reason, FIG. 3 illustrates the metal layer 202, the contact 218 and the metal layer 216 as a single region.

Although not shown, an additional dielectric layer is optionally included within dielectric layer 206 at the lower surface of the trench that includes metal 216. If included, the additional dielectric layer 214 is preferably a different material than either of the adjacent dielectrics and may serve as an etch stop layer, which is useful in forming the via and trench, as a cap layer, as a diffusion barrier, as a passivation layer, or as combinations of these functional layers. As with dielectric 208, this additional dielectric layer can include more than one layer of materials. For example, the dielectric layer can include one or more of a nitride layer (e.g., $Si_3N_4$), an oxynitride layer (e.g., SiON), an oxide layer (e.g., $SiO_2$), a dense oxide layer, or other material. In the preferred embodiment, this layer is eliminated since it will raise the overall dielectric constant of the interlevel dielectric 206 in which it is embedded.

A liner 220 separates the metal material 210/216 from the surrounding dielectric. The liner 220 preferably comprises a diffusion barrier that prevents metal from the interconnect structure 200 from migrating into the adjacent insulators. For example, when a copper interconnect is used, the liner may be a material such as tantalum, tantalum nitride, titanium, titanium nitride, titanium tungsten, tungsten nitride, ruthenium, iridium or platinum. As shown in FIG. 3, the liner 220 is disposed between the conductive contact 218 and the dielectric layer 206 and also between the metal region 216 and the dielectric layer 206. In the preferred embodiment, the liner 220 does not extend between the conductive contact 218 and the metal region 202 or between the conductive contact 218 and the metal region 216.

The structure of FIG. 3 includes a number of advantages over other structures. Since there is a direct metal contact between contact 218 and metal line 202 (e.g., a direct copper to copper contact), the resistance of the via is improved by eliminating the high resistive serial component of the liner 220 underneath the contact 218. In addition, after an anneal process it is possible to create copper grains between the metal line 202 and the via 218. This feature can significantly help with electro migration and stress migration since copper and voids can flow through the interconnects. In addition, the structure is more mechanically stable because of the copper to copper direct contact and inter line/via 202/216 grain growth.

A preferred method of forming the structure of FIG. 3 will now be described with respect to FIGS. 4-9. These figures provide but one example of the process steps. As will be recognized by one of skill in the art, a number of alternatives are possible. For example, while this process flow shows a via first dual damascene process, it is well understood that a trench first (or via last) process flow would work equally as well.

Figure 4:
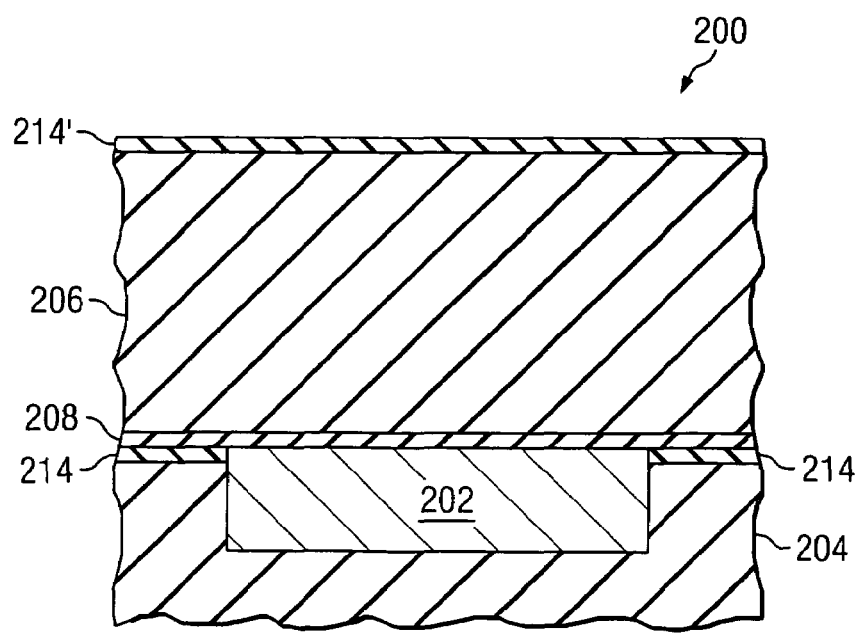
FIGS. 4-9 illustrate cross-sectional views during various stages of fabrication of the structure of FIG. 3.

Referring now to FIG. 4, a partially fabricated integrated circuit is shown. This structure includes metal region 202, which is formed within dielectric layer 204. In the preferred embodiment, the metal region 202 is a copper line formed by a damascene process (either single damascene or dual damascene).

In this particular embodiment, three dielectric layers cover the dielectric layer 204 and metal line 202. In particular, the cap layer 208, the inter metal dielectric (IMD) 206, and the hard mask layer 214 are formed. In the preferred embodiment, the cap layer 208 is formed from a SiCN material, such as NBLOK™. This layer is deposited to a thickness of between about 10 nm and about 60 nm, preferably about 35 nm. It is understood that this dimension, as well as other dimensions, may vary depending upon the level of metal being formed. For example, upper levels of metal tend to have a wider pitch and wider lines than lower levels of metal.

Intermetal dielectric layer (ILD) 206 can have a thickness of between about 250 nm and about 500 nm, for example 270 nm. In the preferred embodiment, this dielectric is dense SiCOH. In other embodiments, other dielectrics can be used. The layer 206 is preferably a low-k dielectric. Examples of porous low-k dielectrics that can be used are pSiCOH, SiLK™, and FLARE™. As discussed above, other materials can alternatively be used.

The hardmask layer 214 is typically made as thin as possible. In fact, this layer 214 can be eliminated if the CMP process, which will be described with respect to FIG. 9, can be controlled so as to avoid damage to ILD 206. When included, the hardmask layer 214 can be deposited to a thickness of 60 nm or more. After CMP, the hardmask layer will typically have a thickness of between about 10 nm to about 20 nm.

Figure 5:
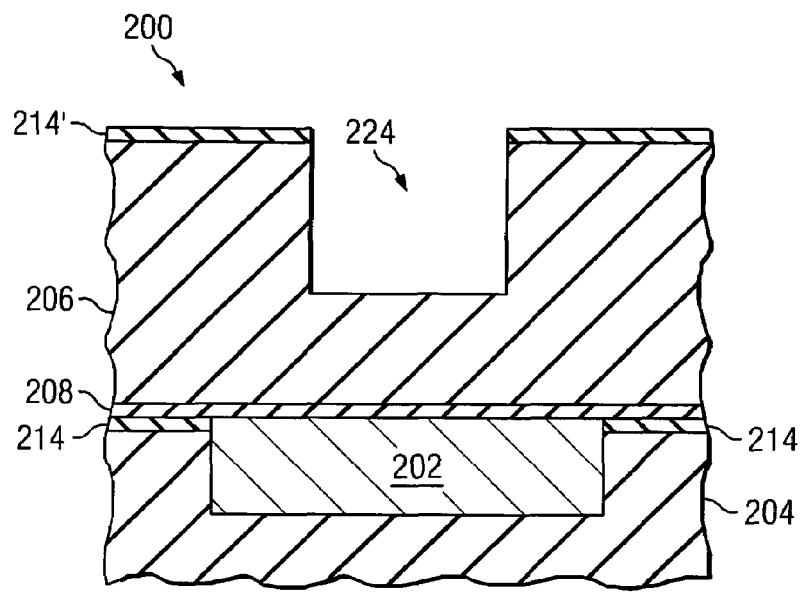
Figure 6:
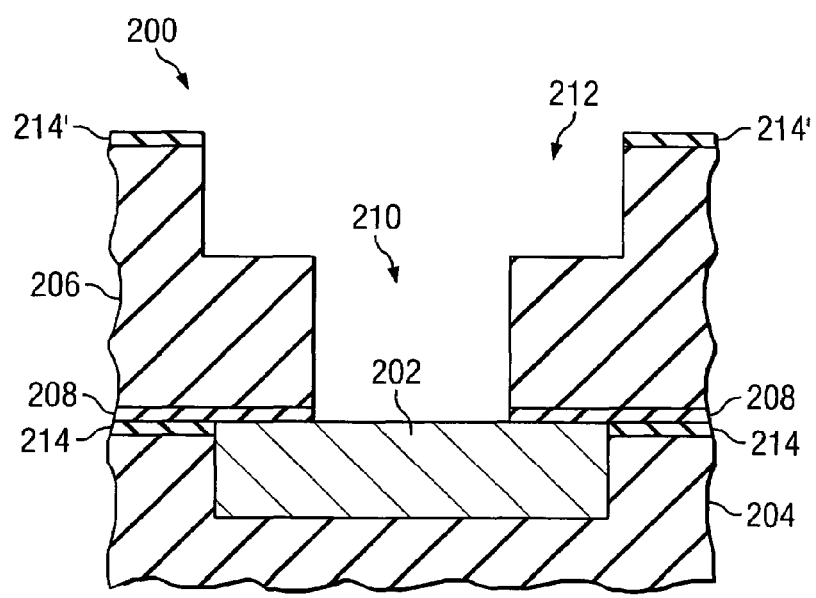

FIGS. 5 and 6 illustrate the formation of the dual damascene structure, which includes a via hole 210 and a trench 212. The trench 212 is one of a number of trenches formed in dielectric layer 206 in the pattern of the metal interconnects. This pattern is determined by the circuit design and necessary interconnections. The via hole 210 is one of number of via holes that will provide a connection between the conductor to be formed in trench 212 with the conductors of underlying structures (e.g., metal line 202).

In the particular embodiment of FIGS. 5 and 6, an opening 224 is formed in an upper portion of dielectric layer 206. Opening 224 is provided in the same location and has the same dimensions of via hole 210, which will be formed in the lower portion of layer 206. The opening 224 is formed by patterning (with a mask that is not shown) the dielectric layer 206 and performing a timed etch until the proper depth is reached. In alternative embodiments (not shown), the opening 224 can be formed all the way to layer 208 (or 202) or until reaching an etch stop layer (not shown). The etching step is preferably an anisotropic etch performed by reactive ion etching (RIE).

Referring now to FIG. 6, a second lithography step is performed to etch the trench 212 in the dielectric layer 206. Once again a mask (not shown) is used to etch dielectric layer 206 until the proper depth is reached. This etching step is preferably a timed etch and etches to a depth of between about 100 nm and about 250 nm. Alternatively, the etch is performed until reaching an etch stop layer (not shown). While etching the trench, the exposed portions of dielectric layer 206 within opening 224 will be etched until reaching the cap layer 208. At this point, the exposed portion of the cap layer 208 is removed to expose metal region 202.

FIG. 6 shows the resulting structure. As noted above, this structure could be formed by a number of processes. The particular process described herein is provided merely as an example.

Figure 7:
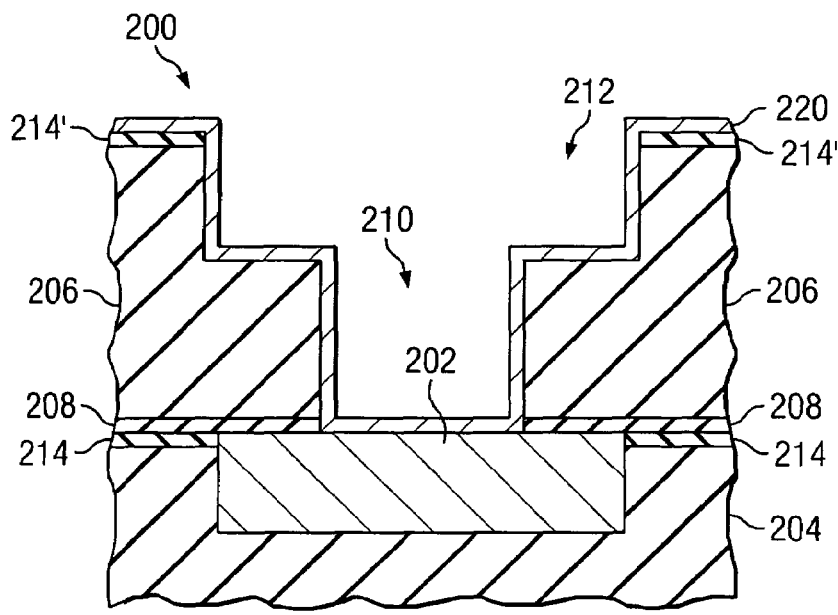

Referring now to FIG. 7, a liner 220 is formed over the surface of the structure. As shown, the liner 220 extends over the upper surface of dielectric layer 206, along sidewall surfaces of the trench 212, over the lower surface of the trench 212, along sidewall surfaces of the via hole 210 and on the upper surface of the copper interconnect line 202. The liner 220 typically comprises a refractory metal or a compound thereof such as tantalum, titanium, tantalum nitride, titanium nitride, titanium tungsten, tungsten nitride, iridium, ruthenium, platinum or combinations thereof. In the preferred embodiment, a tantalum nitride layer is deposited by atomic layer deposition (ALD) to a thickness of between about 1 nm and 5 nm (preferably about 2 nm).

Figure 8:
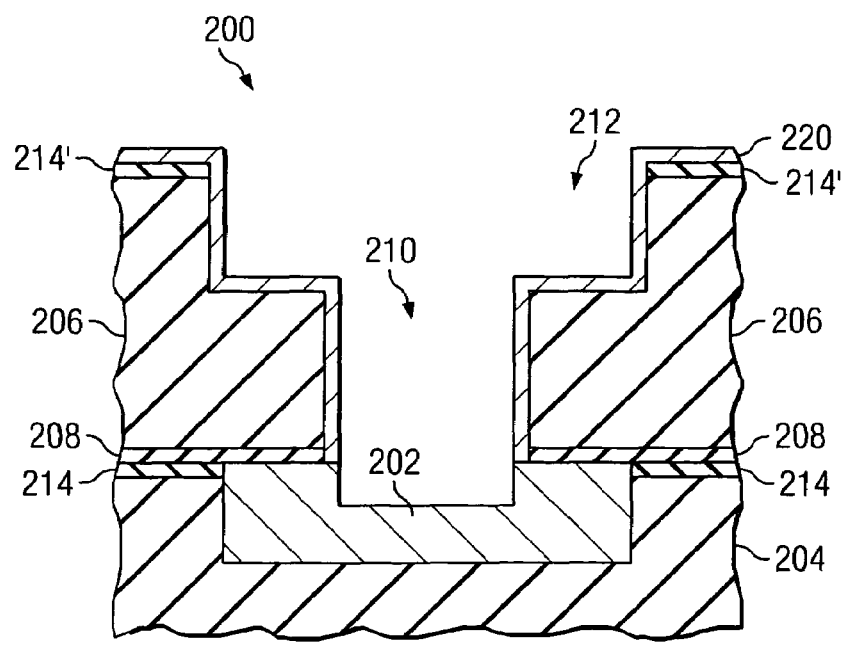

As shown in FIG. 8, a selective etching process is performed to selectively remove the liner 220 from the upper surface of the interconnect 202. This process is selective in that the liner 220 remains over the lower and sidewall surfaces of the trench 212 and the sidewall surface of the via hole 210. While the liner 220 may be thinned at these locations, it preferably will not be removed.

In one specific embodiment, the selective etching process is a deep Argon clean, with the following parameters:

600 sccm Ar,

3000 W LF ignition power.

1250 W LF,

1500 W HF, 300 sccm BSG, temperature <350° C.; and low pressure (e.g., 5e10-7 torr).

In the preferred embodiment, the selective etching process stops after reaching through the liner 220. A wet etch can then be performed to create a recess in the copper connect 202. For example, the recess may extend between about 30 and 40 nm into the copper 202. For example, the recess can be formed to a depth of between about 10% and 30% of the thickness of the copper interconnect 202. In another embodiment, the recess is formed to a depth that is at least 30% of the thickness of the copper interconnect 202. The wet etch is preferably performed with HNO3 (or Ammonium Persulphate) for a time of about 20 to about 60 sec.

Figure 9:
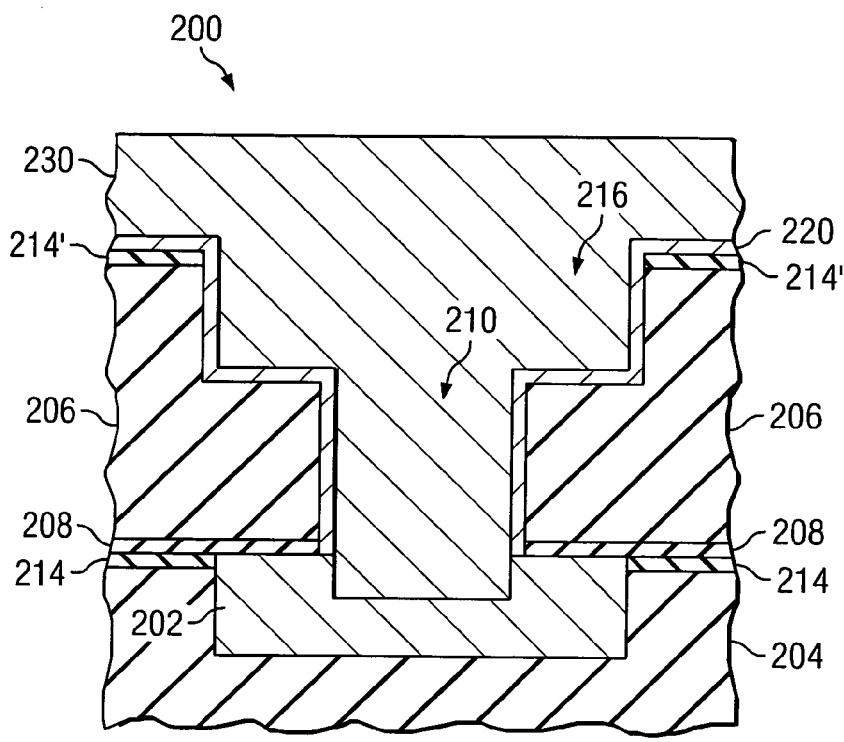

FIG. 9 illustrates that a metal (e.g., copper) 230 is deposited in the via hole 210 and the trench 212. In the preferred embodiment, a copper seed layer is deposited first followed by electrodeposition of copper. In this embodiment, copper is deposited directly within the trench and via hole and in contact with the lower copper interconnect 202 and in contact with remaining portions of the liner 220 along the surfaces of the trench and via. In another embodiment, the copper 230 can be can be electroplated directly on the liner 220 (e.g., a tantalum or ruthenium liner).

The structure of FIG. 9 can then be planarized to complete the upper metal interconnect 216 and provide the structure of FIG. 3. The planarization process is preferably a chemical mechanical polish step. The hard mask 214', if included, will serve to protect the dielectric layer 206.

As shown in FIG. 3, a dielectric cap layer 208' can be deposited over the metal 216 and the dielectric 206 (and dielectric 214', if included). Alternatively, a metal cap layer can be used. In this case, the copper 216 will be recessed within the trench and a metal layer will be formed in an upper portion of the trench.

Figure 10:
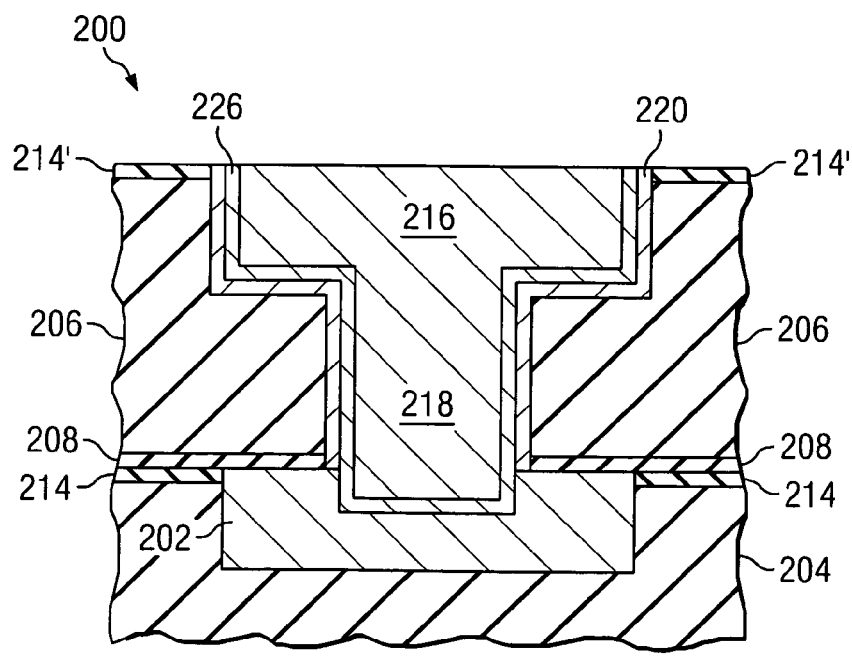
FIG. 10 illustrates a cross-sectional view of an integrated circuit structure of a second embodiment of the invention.

FIG. 10 illustrates an alternative embodiment, which includes a second liner 226. The second liner layer 226 can be deposited prior to depositing the copper seed layer. The second liner layer 226 can be a refractory metal or a compound thereof such as tantalum, titanium, tantalum nitride, titanium nitride, titanium tungsten, or tungsten nitride, or combinations thereof. For example, a tantalum layer can be deposited by physical vapor deposition (PVD) to a thickness of between about 2 nm and 10 nm (preferably about 5 nm). In this structure, the liner 226 overlies the liner 220 along the lower surface of the trench and along the sidewalls of the trench and the via hole but is in direct contact with copper 202 and 216 within the conductive path of the interconnect.

Figure 11:
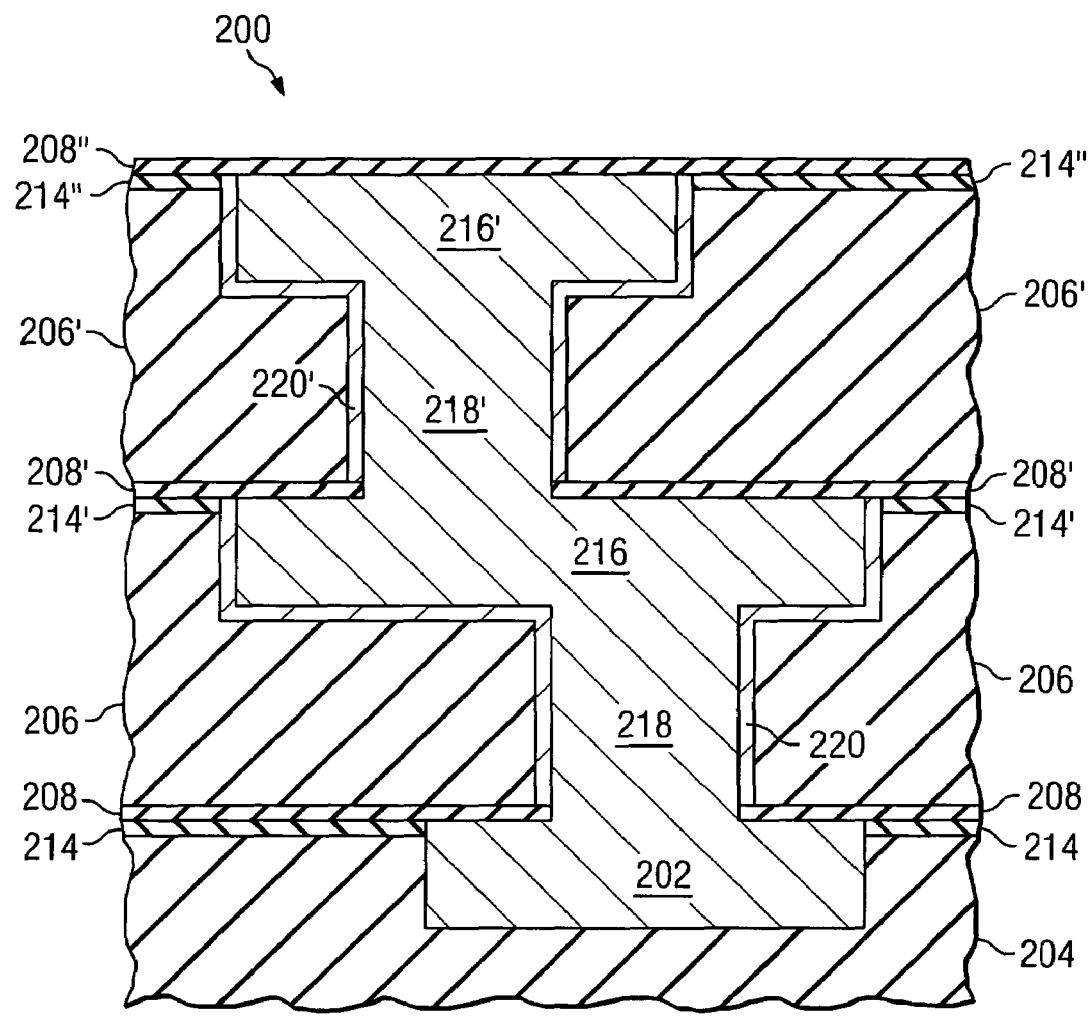
FIG. 11 illustrates a cross-sectional view of a variation of the embodiment of FIG. 3.

FIG. 11 illustrates a structure that includes an additional metal interconnect 216' and via 218' over the structure of FIG. 3. This figure is provided to illustrate the fact that the interconnect structure of the present invention can be provided for a number of metallization levels. For example, an integrated circuit can have ten or more metal layers, each of which is formed by the process described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a semiconductor device, the method comprising:
   providing a workpiece that includes a conductive region;
   forming a dielectric layer over the conductive region;
   forming a dual damascene structure within the dielectric layer, the dual damascene structure including a trench that overlies a via hole, the via hole overlying the conductive region;
   forming a liner along sidewalls and a lower surface of the trench and along sidewalls of the via hole, the liner also being formed over an upper surface of the conductive region, the liner having a thickness on the lower surface of the trench;
   removing the liner from above the upper surface of the conductive region to expose the upper surface of the conductive region without substantially decreasing the thickness of the liner on the lower surface of the trench, wherein after the removing process at least a portion of the liner remains on the lower surface of the trench and along the sidewalls of the trench and the via hole;
   etching a recess in the upper surface of the conductive region, wherein the recess comprises a depth of between about 10% and about 30% of a thickness of the conductive region; and
   forming conductive material within the dual damascene structure.

2. The method of claim 1 wherein the conductive region comprises a copper region and wherein the conductive material comprises copper.

3. The method of claim 2, wherein the conductive material is formed so that a single grain of copper extends over an interface between the conductive material and the conductive region.

4. The method of claim 1 wherein the dielectric layer comprises a low-k dielectric material.

5. The method of claim 4 wherein the dielectric layer comprises SiCOH.

6. The method of claim 4 wherein the dielectric layer comprises a porous low-k dielectric.

7. The method of claim 1, further comprising:
   stopping the removing of the liner after the upper surface of the conductive region is exposed; and
   after stopping, performing a wet etch to etch the recess in the upper surface of the conductive region.

8. The method of claim 7, wherein the conductive material physically contacts the conductive region and wherein the conductive material is separated from the dielectric layer by the remaining portion of the liner.

9. A method of forming a dual damascene copper interconnect structure, the method comprising:
   providing a wafer with a first copper interconnect line formed over an upper surface of the wafer, the first copper interconnect line having a thickness;
   forming a dielectric layer over the first copper interconnect line;
   forming a trench within an upper portion of the dielectric layer, the trench at least partially overlying the first copper interconnect line;
   forming a via hole in a lower portion of the dielectric layer such that the via hole is disposed beneath the trench and overlies the first copper interconnect line;
   depositing a first liner over the wafer, the first liner extending over an upper surface of the dielectric layer, a sidewall surface of the trench, a lower surface of the trench, a sidewall surface of the via hole and an upper surface of the first copper interconnect line;
   performing a selective etching process, the selective etching process selectively removing the first liner from the upper surface of the first copper interconnect line so that at least a portion of the first liner remains over the sidewall surface of the trench, the lower surface of the trench, and the sidewall surface of the via hole, the selective etching process stopping after reaching through the first liner;
   after stopping the selective etching process, performing a second etching process thereby creating a recess in the first copper interconnect line beneath the via hole, the recess extending to a depth that is between 10% and 30% of the thickness of the first copper interconnect line;
   after creating the recess, depositing a second liner over the upper surface of the dielectric layer, the sidewall surface of the trench, the lower surface of the trench, the sidewall surface of the via hole and the first copper interconnect line;
   depositing copper within the via hole, the copper being separated from the upper surface of the dielectric layer, the sidewall surface of the trench, the lower surface of the trench and the sidewall surface of the via hole by the first and second liners and the copper being separated from the first copper interconnect line by the second liner but not by the first liner; and
   planarizing an upper surface of the deposited copper such that the copper deposited in the trench forms a second copper interconnect line.

10. The method of claim 9, wherein the dielectric layer comprises a low-k dielectric material.

11. The method of claim 10, and further comprising forming a hard mask layer over the dielectric layer prior to forming the trench and the via hole, wherein planarizing an upper surface of the deposited copper comprises thinning the hard mask layer.

12. The method of claim 9, wherein depositing copper comprises:
depositing a copper seed layer over the second liner; and
electrodepositing copper over the copper seed layer.

13. The method of claim 9, wherein depositing copper comprises electroplating copper onto the second liner without use of a copper seed layer.

14. A method of fabricating a semiconductor device, the method comprising:
providing a workpiece that includes a conductive region;
forming a dielectric layer over the conductive region;
forming a dual damascene structure within said dielectric layer, the dual damascene structure including a trench that overlies a via hole, the via hole overlying the conductive region;
forming a liner along sidewalls and a lower surface of the trench and along sidewalls of the via hole, the liner also being formed over an upper surface of the conductive region;
removing the liner from over the upper surface of the conductive region to expose the upper surface of the conductive region;
forming a recess in said conductive region, said recess having a depth which is between about 10% and about 30% of a height of said conductive region; and
forming a conductive material within the damascene structure.

15. The method of claim 14, wherein said recess is formed by an anisotropic etch.

16. The method of claim 14, wherein the conductive material comprises copper and wherein the conductive region comprises copper.

17. The method of claim 16, wherein forming a conductive material within the dual damascene structure comprises forming the conductive material in physical contact with the conductive region.

18. The method of claim 14, wherein forming a conductive material within the dual damascene structure comprises forming the conductive material in physical contact with the conductive region.

19. The method of claim 14, wherein removing the liner comprises performing an etching process to selectively remove the liner from the upper surface of the conductive region so that at least a portion of the liner remains over the sidewall surface of the trench, the lower surface of the trench, and the sidewall surface of the via hole.

20. The method of claim 14, further comprising forming a second liner after removing the liner from over the upper surface of the conductive region and forming the recess, the conductive material being formed over the second liner.

21. The method of claim 14, wherein the dielectric layer comprises a low-k dielectric material.

22. The method of claim 21, further comprising:
forming a hard mask layer over the dielectric layer prior to forming the dual damascene structure; and
planarizing an upper surface of the workpiece after forming the conductive material within the dual damascene structure, wherein planarizing thins the hard mask layer.

23. The method of claim 14 wherein forming a conductive material within the dual damascene structure comprises depositing a copper seed layer over the liner, and electrodepositing copper over the copper seed layer.

24. The method of claim 14 wherein forming a conductive material within the dual damascene structure comprises electroplating copper onto the liner without use of a copper seed layer.

25. The method of claim 14, wherein the dielectric layer comprises SiCOH.

26. A method of fabricating a semiconductor device, the method comprising:
providing a workpiece that includes a conductive region;
forming a dielectric layer over the conductive region;
forming a dual damascene structure within the dielectric layer, the dual damascene structure including a trench that overlies a via hole, the via hole overlying the conductive region;
forming a liner along sidewalls and a lower surface of the trench and along sidewalls of the via hole, the liner also being formed over an upper surface of the conductive region, the liner having a thickness on the lower surface of the trench and the upper surface of the conductive region;
removing the liner from over the upper surface of the conductive region to expose the upper surface of the conductive region, wherein after the removing process at least a portion of the liner remains over the lower surface of the trench and the sidewalls of the trench and the via hole;
etching a recess in the upper surface of the conductive region, wherein the recess comprises a depth of between about 10% and about 30% of a thickness of the conductive region; and
forming conductive material within the dual damascene structure.

27. The method of claim 26, further comprising:
stopping the removing of the liner after the upper surface of the conductive region is exposed; and
after stopping, performing a wet etch to etch the recess in the upper surface of the conductive region.

28. The method of claim 26, wherein the conductive material physically contacts the conductive region and wherein the conductive material is separated from the dielectric layer by the remaining portion of the liner.

29. The method of claim 26, wherein the conductive region comprises a copper region and wherein the conductive material comprises copper.

30. The method of claim 26, wherein the dielectric layer comprises a low-k dielectric material.

31. The method of claim 30, wherein the dielectric layer comprises SiCOH.

32. The method of claim 30, wherein the dielectric layer comprises a porous low-k dielectric.

33. The method of claim 26, wherein removing the liner comprises thinning the liner on the lower surface of the trench.

* * * * *